(12) United States Patent
Martin et al.

(10) Patent No.: US 8,507,031 B2
(45) Date of Patent: Aug. 13, 2013

(54) METHOD FOR PRODUCING AT LEAST ONE MICROCOMPONENT WITH A SINGLE MASK

(75) Inventors: Steve Martin, Saint-Sauveur (FR);
 Nicolas Dunoyer, Grenoble (FR); Sami Oukassi, Saint-Egreve (FR); Raphael Salot, Lans-en-Vercors (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 164 days.

(21) Appl. No.: 12/796,922

(22) Filed: Jun. 9, 2010

(65) Prior Publication Data

US 2010/0310758 A1  Dec. 9, 2010

(30) Foreign Application Priority Data

Jun. 9, 2009  (FR) ...................... 09 02785

(51) Int. Cl.
 *B05D 5/12* (2006.01)
(52) U.S. Cl.
 USPC .......... 427/79; 427/97.1; 427/97.3; 427/98.4; 427/282
(58) Field of Classification Search
 USPC ......... 427/79, 97.1, 97.3, 98.4, 282; 118/504
 See application file for complete search history.

(56) References Cited

U.S. PATENT DOCUMENTS

| | | | | |
|---|---|---|---|---|
| 3,276,423 A * | 10/1966 | Triller | | 118/504 |
| 3,330,696 A * | 7/1967 | Ullery et al. | | 216/6 |
| 3,412,456 A * | 11/1968 | Ebisawa | | 438/670 |
| 4,324,815 A * | 4/1982 | Mitani et al. | | 427/98.4 |
| 5,393,696 A * | 2/1995 | Koh et al. | | 438/613 |
| 5,561,004 A | 10/1996 | Bates et al. | | |
| 5,776,359 A | 7/1998 | Schultz et al. | | |
| 6,238,741 B1 * | 5/2001 | Blazick et al. | | 427/79 |
| 2004/0231595 A1 | 11/2004 | Takeuchi et al. | | |
| 2005/0034810 A1 | 2/2005 | Yamazaki et al. | | |
| 2005/0079418 A1 * | 4/2005 | Kelley et al. | | 429/231.95 |

FOREIGN PATENT DOCUMENTS

EP  1 319 732 A1  6/2003

* cited by examiner

*Primary Examiner* — Brian K Talbot
(74) *Attorney, Agent, or Firm* — Oliff & Berridge, PLC (57) ABSTRACT

The microcomponent, for example a microbattery, comprising a stack with at least two superposed layers on a substrate, is made using a single steel mask able to expand under the effect of temperature. The mask comprises at least one off-centered opening. The mask being at a first temperature, a first layer is deposited through the opening of the mask. The mask being at a second temperature, higher than the first temperature, a second layer is deposited through the opening of the mask. Finally, the mask being at a third temperature, higher than the second temperature, a third layer is deposited through the opening of the mask.

14 Claims, 7 Drawing Sheets

METHOD FOR PRODUCING AT LEAST ONE MICROCOMPONENT WITH A SINGLE MASK

BACKGROUND OF THE INVENTION

The invention relates to a method for producing at least one microcomponent comprising at least one stack of layers on a substrate, each stack comprising at least two layers, a first layer being deposited with a first pattern and a second layer with a second pattern, different from the first pattern and at least partially covering the first pattern.

STATE OF THE ART

Figure 1:
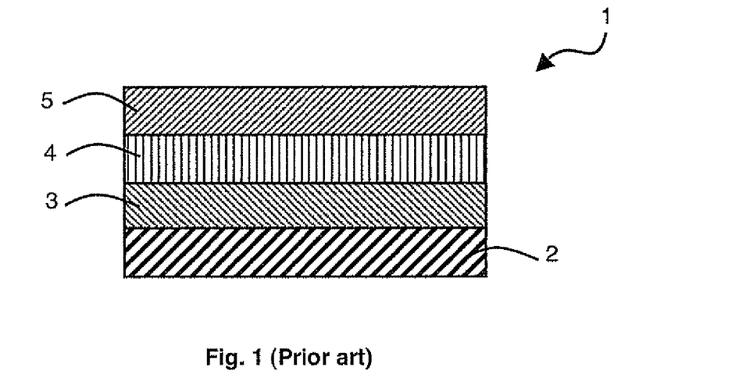
FIG. 1 is a schematic representation of an ideal stack of layers.
Figure 2:
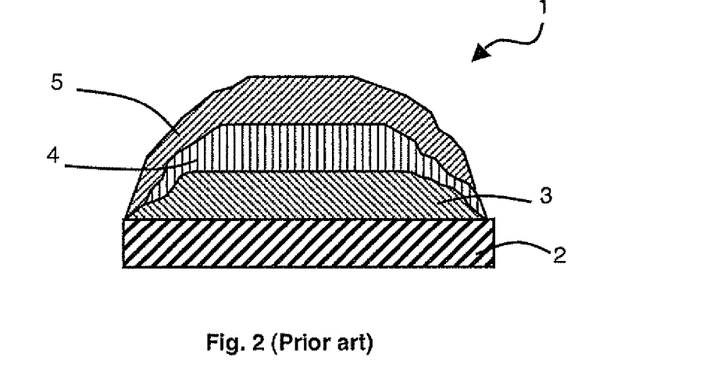
FIG. 2 is a schematic representation of a stack of layers according to the prior art.

Certain microcomponents are conventionally produced by forming a successive stack of layers on a substrate. The number of layers is more than or equal to two. FIG. 1 represents the case of an ideal stack 1 on a substrate 2 on which three layers (3, 4, 5) are uniformly deposited. The techniques used to produce these stacks 1 are numerous. In particular, the stencil technique is commonly used. This technique consists in successively depositing the active layers (3, 4, 5) of the microcomponent by vacuum deposition techniques, for example Physical Vapor Deposition (PVD), through masks. This method is advantageous compared with the traditional microfabrication methods used in microelectronics such as photolithography and etching. This method is in fact simple to implement and inexpensive. The use of a mask for deposition can however give rise to inhomogeneities of thickness of the deposited layers (3, 4 and 5) due among other things to the thickness of the mask. These inhomogeneities of thickness generally constitute edge effects and can lead to short-circuiting of the microcomponent in the case of conductive layers. FIG. 2 illustrates the case of a stack with such edge effects. In this example, layer 5 is in contact with layer 3 (on the left of the figure), causing a short-circuit if these two layers are conductive.

These microcomponents are for example thin-film microbatteries. A microbattery is an electrochemical energy storage component the thickness whereof is generally less than 15 µm. A microbattery comprises at least one stack 1 of at least three layers on a substrate 2, layer 3 forming a cathode, layer 4 formed by an electrolyte, and layer 5 forming an anode.

Figure 3:
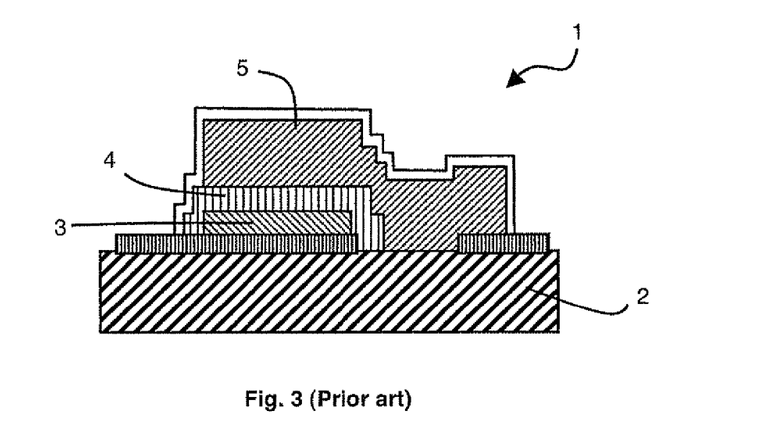
FIG. 3 is a schematic representation in cross-section of a microbattery according to the prior art.

U.S. Pat. No. 5,561,004 proposes an architecture avoiding any contact between layer 3 and layer 5 so as to prevent short-circuiting between cathode and anode. FIG. 3 represents the architecture of a microbattery according to U.S. Pat. No. 5,561,004. Electrolyte layer 4 is of larger size than cathode layer 3 so as to cover the latter completely. Electrolyte layer 4 being electrically insulating, short-circuiting is prevented.

Figure 4:
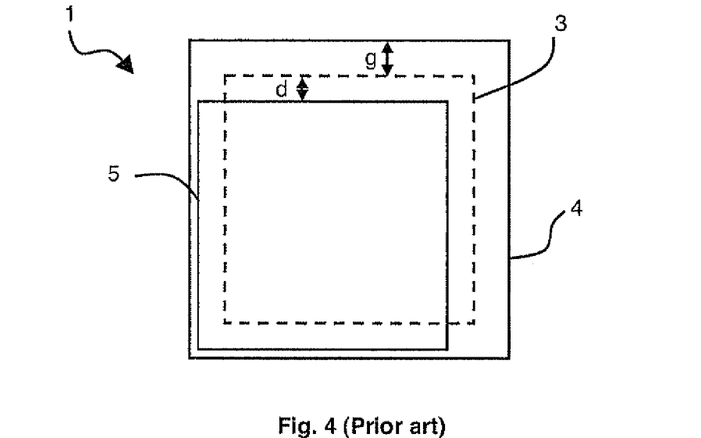
FIG. 4 illustrates a part of the stack constituting the microbattery of FIG. 3 in simplified top view.

Nevertheless, this architecture requires the use of several masks. On account of the uncertainties of positioning linked to machining imperfections and to the successive repositionings of the masks, large clearances have to be respected. These clearances, which correspond to the lateral thickness of layer 4 at the periphery of layer 3, prevent any direct contact between layers 3 and 5 constituting the electrodes and can have a width of up to about 100 µm. These clearances reduce the active surface of the component, i.e. the ion exchange surface between the anode and cathode materials, thereby reducing its energy storage capacity. Such a structure is represented in simplified top view (i.e. without substrate 2, or collectors, or external protection layer) in FIG. 4. Taking a clearance g of 100 µm into account for a maximum misalignment d of 100 µm between the masks used to form respectively cathode layer 3, electrolyte layer 4 and anode layer 5, the loss of active surface (surface common to layers 3 to 5) for a micro-battery with a surface of 0.25 $cm^2$ can be up to about 12%.

OBJECT OF THE INVENTION

The object of the invention is to provide a method for producing at least one microcomponent remedying the shortcomings of the prior art. More particularly, the object of the invention is provide a method for producing that is fast and easy to implement, enabling the problems linked to misalignment of the masks to be overcome.

According to the invention, this object is achieved by the fact that successive deposition of the different layers of one of the stacks is performed through a same opening of a same mask, the mask being heated to a first temperature to form the first pattern, and to a second temperature, different from the first temperature, to form the second pattern.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Each stack of the microcomponent comprises at least two layers. A first layer is deposited with a first pattern and a second layer is then deposited with a second pattern, different from the first pattern, i.e. of different shape or size. The second pattern at least partially covers the first pattern. To achieve such a microcomponent, a mask is placed above the substrate and the deposition operations of the patterns are performed successively through an opening of the mask. The mask is preferably made from steel for a silicon substrate. It can also be made for example from molybdenum, aluminum, copper, or Invar® (36% Fe—Ni alloy from Imphy Alloys) depending on the substrate used.

Figure 5:
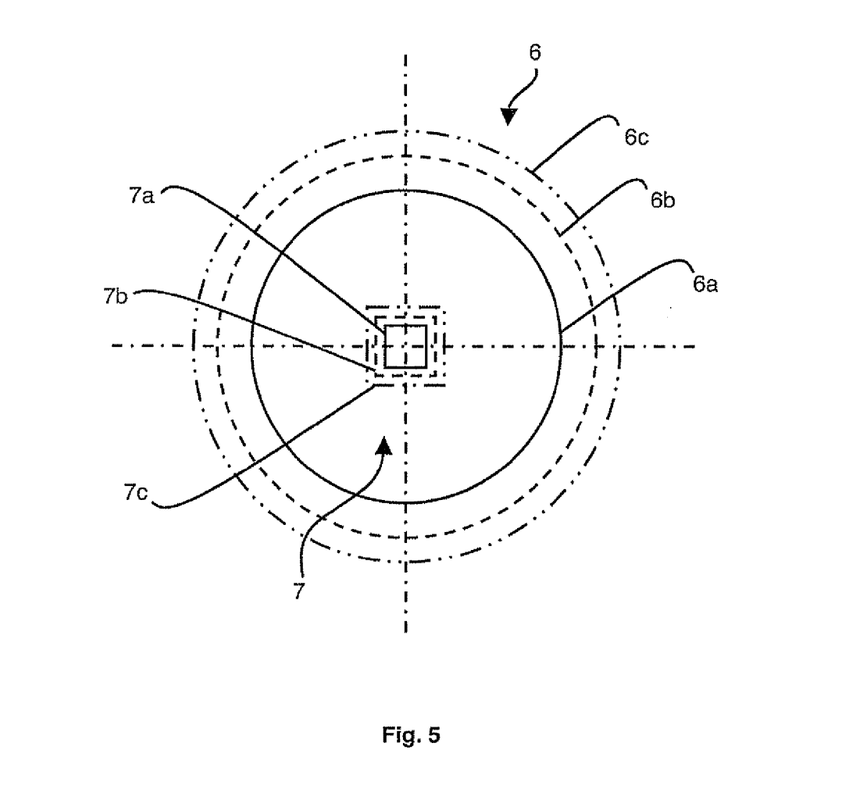
FIG. 5 represents a particular embodiment of a mask able to be used in the method according to the invention.

In the embodiment of FIG. 5, mask 6 expands or retracts respectively if the temperature increases or decreases. Mask 6 comprises a central opening 7. Mask 6, initially heated to a temperature T1, is represented in unbroken lines (6a), with the corresponding opening 7, also in unbroken lines (7a). When heated to a temperature T2, higher than T1, mask 6 expands (broken lines 6b), as does opening 7 (broken lines 7b). Likewise, at a temperature T3, higher than T2, mask 6 and opening 7 become even larger (mixed lines 6c and 7c). Thus, references 6a, 6b and 6c represent the same mask 6 at different temperatures. Likewise, references 7a, 7b and 7c represent the same opening 7 at these different temperatures.

Figure 6:
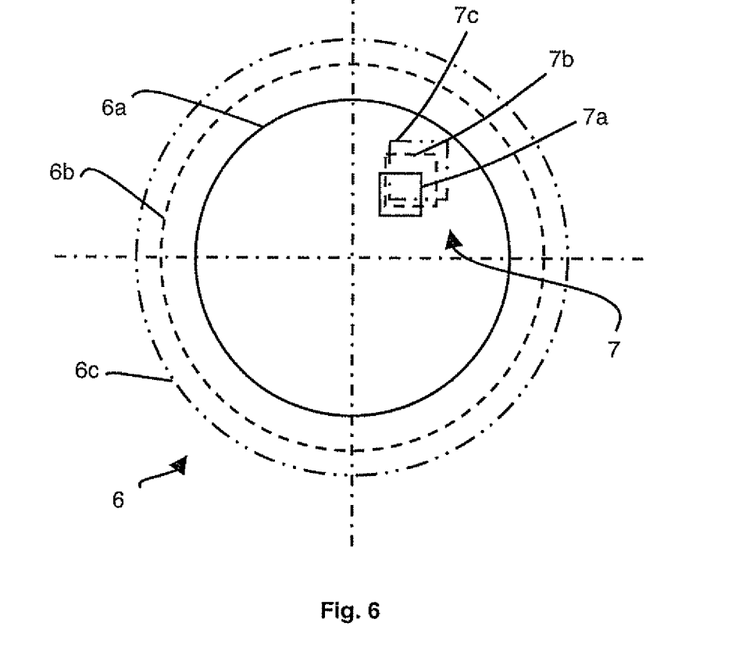
FIG. 6 represents a preferred embodiment of a mask able to be used in the method according to the invention.

In the preferred embodiment of FIG. 6, mask 6a, at temperature T1, comprises an off-centered opening 7a. As before, the mask expands or retracts according to the temperature variations (6b and 7b at temperature T2>T1, and 6c and 7c at temperature T3>T2).

Opening 7 in mask 6 is used for successively depositing the different layers of a stack. By modifying the temperature of mask 6, the size of opening 7 in fact varies. The mask is thus heated to first temperature (T1) to deposit the first layer and form the first pattern, and to second temperature (T2), different from the first temperature, to deposit the second layer and thus form the second pattern.

Figure 7:
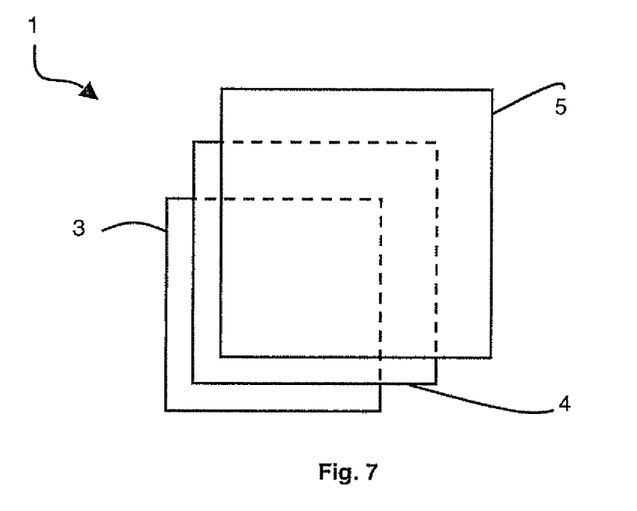
FIGS. 7 and 8 are schematic representations of a stack of layers obtained with a mask of FIG. 6, respectively in top view and in cross-section.
Figure 8:
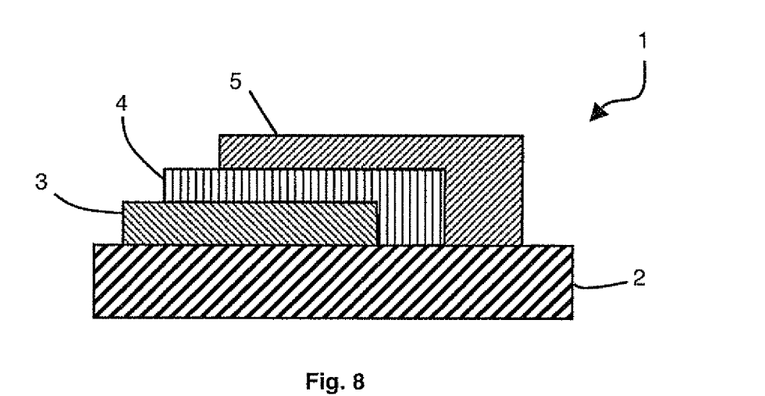

In the embodiment of FIGS. 7 and 8, deposition of layers 3, 4 and 5, with different patterns, is performed successively through the same opening 7 of the same mask 6, preferably using the mask of FIG. 6. Thus, mask 6 being at temperature T1, layer 3 is deposited through opening 7a of mask 6a. Then, mask 6 being at temperature T2, higher than T1, layer 4 is deposited through opening 7b of mask 6b. Finally, mask 6 being at temperature T3, higher than T2, layer 5 is deposited through opening 7c of mask 6c. FIG. 8 shows an offset between the patterns of stack 1 with respect to one another, in a parallel direction to substrate 2. Indeed, as illustrated in FIG. 7, when it expands, the off-centered opening is shifted.

The method described above uses a single mask for the successive depositions. No mask handling is therefore necessary thereby avoiding problems linked to misalignment of the masks. Furthermore, controlling the geometry of the patterns by thermal expansion of the mask enables a shift between two superposed patterns of about 10 μm to be obtained, whereas the prior art shows a shift of up to 100 μm. The method described above more particularly enables the loss of active surface of the microcomponent to be reduced. As described above, if the temperature of the mask is modified so as to always vary in the same direction (increasing or decreasing) when proceeding from deposition of one layer to that of the next layer, any direct contact of layers 3 and 5 is avoided. In the case of a microbattery, short-circuiting of electrode layers 3 and 5 is then prevented. For example for a microbattery with a surface of 25 mm$^2$, situated at a distance of 5 cm from the edge of the silicon substrate, the expansion of a steel mask is 10 μm with respect to the silicon substrate for a temperature variation of 20° C. The loss of active surface of a battery made up of three layers formed at temperatures increasing by 20° C. steps is about 0.4% against 12% for a microbattery produced according to the prior art. The method used thereby enables both the active surface of the microbattery to be maximized and any short-circuiting of the anode and cathode to be prevented.

Figure 9:
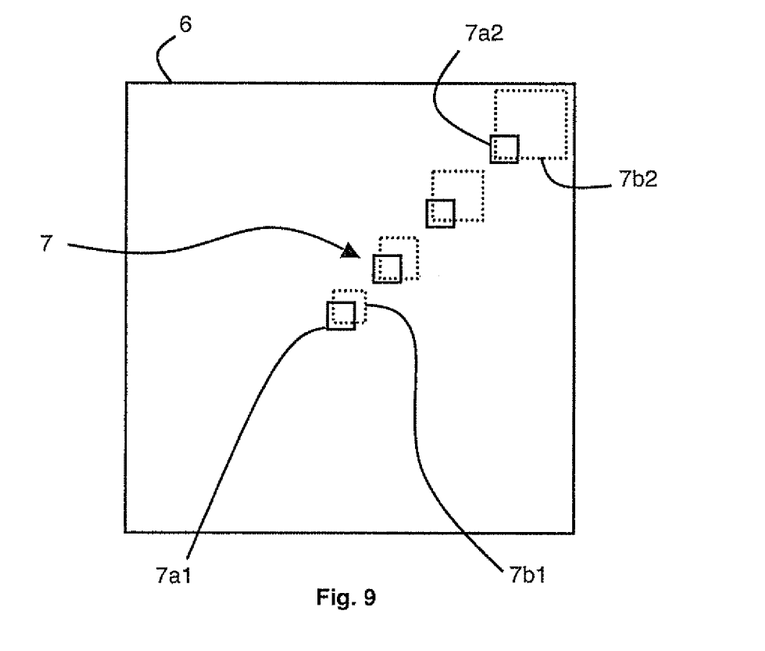
FIGS. 9, 10 and 13 represent top views of other particular embodiments of a mask able to be used in the method according to the invention.

Mask 6 preferably comprises a plurality of openings 7 arranged in regular and ordered manner (FIGS. 9, 10 and 13) so as to simultaneously achieve several stacks 1, thereby increasing the yield of the method. Each opening 7 is associated with a different stack 1. However, controlling expansion of a mask 6 of large dimensions comprising a large number of openings is difficult to achieve. Expansion of mask 6 does in fact vary with the distance with respect to its center. This is represented in FIG. 9 in the case of a portion of mask 6 with four openings 7. For the same temperature increase, an opening 7 close to the center (7a1, 7b1) of mask 6 expands less than an opening 7 at the end (7a2, 7b2) of mask 6. Furthermore, in this embodiment, to prevent overlapping of different layers of several stacks, the dimensioning of each opening 7 should preferably take account of the maximum dimensions of opening 7 after expansion, also called maximum expansion dimension.

Figure 10:
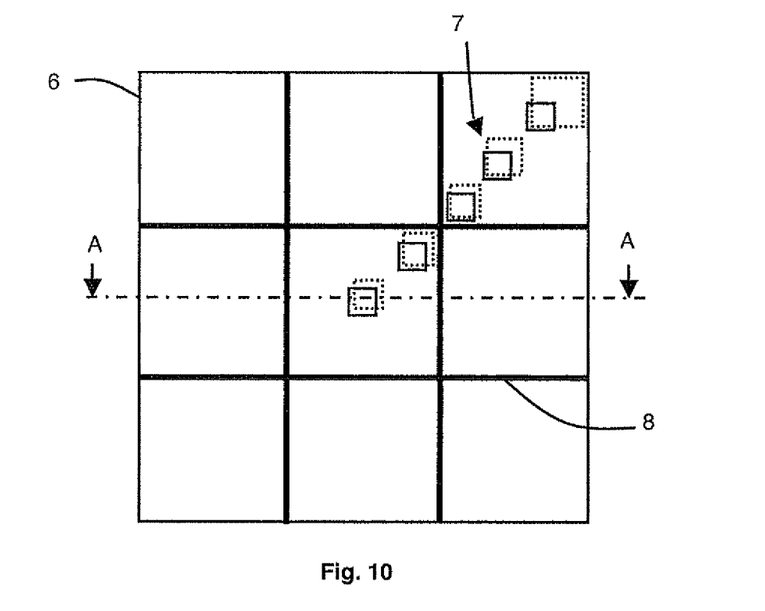

For large-dimension masks, the maximum expansion dimension of openings 7 can reach 100 μm, reducing the active surface of the microcomponent. Furthermore, the integration density on mask 6, and therefore on substrate, remains low in this case. In order to reduce the maximum expansion dimension, mask 6 is advantageously subdivided into at least two elemental parts separated by expansion joints 8. In FIG. 10, mask 6 is for example divided into nine sub-parts by four joints 8. These expansion joints are made for example from polymer material such as rubber, polyurethane or polypropylene.

Figure 11:
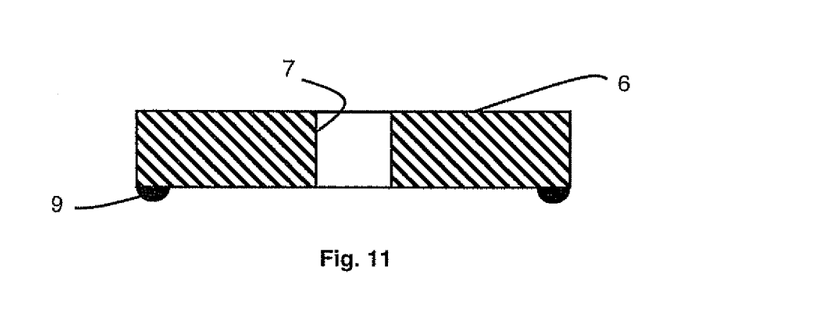
FIGS. 11 and 12 represent two alternative embodiments of a mask able to be used in the method according to the invention, in cross-section along A-A.
Figure 12:
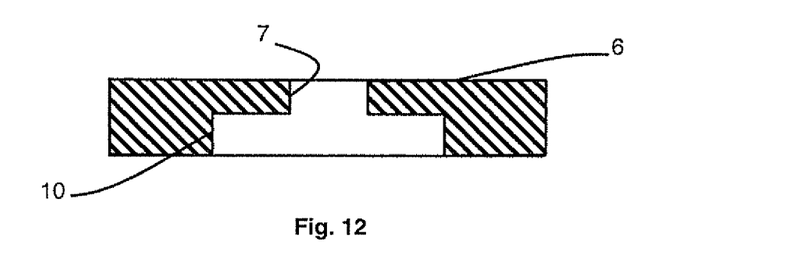

In the foregoing embodiments, the mask is generally pressed onto the substrate by its own weight. When the mask is deformed due to the action of the temperature, it may damage the previously deposited layers, for example by scratching the latter. To remedy this problem, mask 6 advantageously comprises shims 9, at the bottom part thereof, to raise mask 6 with respect to the substrate (FIG. 11). Mask 6 can also comprise a recess 10 around each opening 7, on the bottom surface thereof, on the side where the substrate is located (FIG. 12). In an alternative embodiment, the recess can be common to all the openings, forming a continuous shim at the periphery of the mask.

Figure 13:
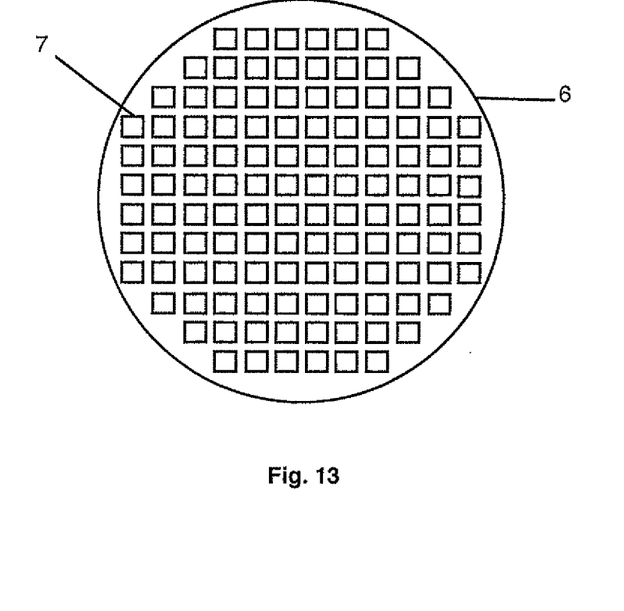

In the preferred embodiment described above, the mask comprises a plurality of off-centered openings. In the example of FIG. 13, mask 6 comprise one hundred and twenty openings 7. Each opening 7 is in the shape of a parallelogram, in general a square. Other shapes also exist for the openings according to the geometry of the pattern to be made. Each opening enables a distinct stack to be formed. The distance between two adjacent openings 7 of mask 6 and the different temperatures can be chosen such as to form distinct microcomponents, of microbattery type for example, each comprising a single stack of patterns. Indeed, the difference between the temperature of the mask used to simultaneously form the first layers of the different stacks, and the temperature of the mask used to simultaneously form the last layers of the different stacks, fixes the maximum offset between the first and last pattern, if this offset is smaller than the distance between adjacent openings, independent stacks are obtained.

For example purposes, the mask of FIG. 13 can be used to fabricate microbatteries, each formed by a stack, on a silicon wafer with a diameter of 200 mm and a thickness of about 500 μm. The substrate is covered by a layer of silicon nitride with a thickness of about 100 nm, by chemical vapor deposition. A steel mask with a diameter of 200 mm and a thickness of about 300 μm is pressed by its own weight onto this substrate. Square openings with 10 mm sides are made in this mask. They are spaced apart from one another by a distance of about 2.5 mm. A recess with a depth of 0.15 mm and a width of 0.15 mm is made at the periphery of each opening to prevent scratching phenomena of the layers when expansion takes place. The maximum expansion dimension is calculated from the location of the batteries farthest away from the center of the wafer. This dimension is estimated at 0.75 μm/C.°

The assembly is placed in an industrial vacuum deposition machine of Endura® type from the Applied Materials company. In this type of equipment, five deposition chambers enable the different active layers of the battery to be formed successively on the same equipment without any manual operation. A first layer of tungsten (cathode collector) with a thickness of about 300 nm is thus deposited, the substrate and the mask both being maintained at a temperature of 40° C. by means of a temperature-controlled substrate holder. The substrate/mask assembly is then loaded into a second chamber and heated to a temperature of 60° C., and deposition of titanium oxysulfide (TiOS) (cathode) with a thickness of about 1.5 μm is performed. Then the assembly is loaded into a third chamber and heated to a temperature of 80° C. Deposition of UPON (electrolyte) with a thickness of about 1 μm is then performed. The assembly is loaded into a fourth chamber and heated to a temperature of 100° C. Deposition of lithium (anode) with a thickness of about 1 μm is then performed. Finally the substrate/mask assembly is loaded into a fifth and last chamber and heated to a temperature of 120° C. Deposition of titanium (anode collector) with a thickness of about 250 nm is then performed.

The total temperature gradient in the course of these deposition steps is 80° C. The maximum expansion dimension is therefore 60 μm. The adjacent openings being separated by 2.5 mm, there is no overlap from one stack to the other on account of the offset between the first and last layers. The maximum active surface loss is 1.6%.

In an alternative embodiment, microcomponents each comprising several stacks 1 can be achieved. Openings 7 associated with stacks 1 of the same microcomponent therefore form a group 11 of openings, like the one represented in FIG. 14. In this case, the choice of the distance between two adjacent openings of one and the same group 11 and of the different temperatures enables two adjacent stacks of the same microcomponent to be connected in series. This particular embodiment is illustrated in FIG. 15. By choosing the distance between two openings smaller than the maximum offset between first pattern 12 and last pattern 13, fixed by the total temperature gradient, the last layer of a stack 1 in fact overlaps the first layer of the adjacent stack 1. This configuration is particularly interesting in the case of microbatteries.

Finally, the distance between two groups 11 of openings 7 is chosen sufficiently large to form separate microcomponents each comprising several stacks 1 connected in series.

Figure 14:
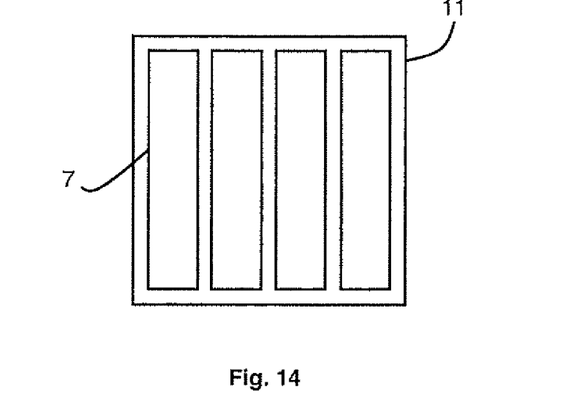
FIG. 14 represents an alternative embodiment of an opening of the mask of FIG. 13.
Figure 15:
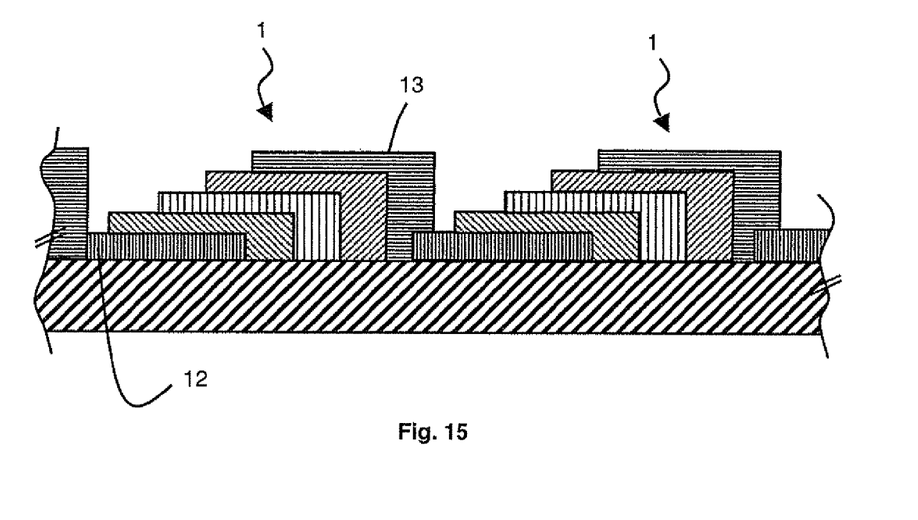
FIG. 15 represents a particular embodiment of a microcomponent, with a mask according to FIG. 14.

For example purposes, group 11 of openings of FIG. 14 is reproduced in periodic manner on the mask. The distance between two openings within the same group 11 is about 80 μm. The other parameters of the mask are unchanged with respect to the previous example. The substrate is also identical. The thickness and nature of the five layers remain unchanged, only the deposition temperatures change.

Tungsten deposition is performed at a mask temperature of 40° C. TiOS deposition is performed at a mask temperature of 70° C. LiPON deposition is performed at a mask temperature of 100° C. Lithium deposition is performed at a mask temperature of 130° C. Titanium deposition is performed at a mask temperature of 160° C.

The total temperature gradient in the course of these deposition steps is 120° C. The maximum expansion dimension is therefore 90 μm. Two groups of adjacent openings are separated by 2.5 mm, and there is no overlap from one microcomponent to the other. However, within a group of openings, the successive offsets of an opening according to the temperature gradient (a total of 90 μm) cause an overlap of the anode and cathode collector layers of two adjacent stacks, corresponding to two adjacent openings within the group. These stacks are then connected in series.

The invention claimed is:

1. Method for producing at least a microcomponent comprising at least a stack of layers on a substrate, the stack comprising a first layer defining a first pattern and a second layer defining a second pattern, different from the first pattern, the method comprising the successive steps of:
   placing a mask comprising an opening above the substrate so that it can expand or retract by sliding on the surface of the substrate, a center portion of the mask being immobile with respect to the substrate during and between deposition steps;
   depositing the first layer through the opening of the mask at a first temperature to form the first pattern;
   heating the same mask to a second temperature, different from the first temperature; and
   depositing the second layer through the same opening of the mask at the second temperature to form the second pattern shifted from the first pattern and overlapping the first pattern.

2. Method according to claim 1, wherein the mask is made of steel.

3. Method according to claim 1, wherein the opening of the mask is off-centered to offset the first and second patterns with respect to one another, in a direction parallel to the substrate.

4. Method according to claim 1, wherein each opening is in the shape of a parallelogram.

5. Method according to claim 1, wherein the mask comprises a plurality of openings, each associated with a different stack, arranged in regular and ordered manner, the different stacks being fabricated simultaneously.

6. Method according to claim 5, wherein the distance between two adjacent openings and the difference between the temperature of the mask used to simultaneously form the first layers of the different stacks, and the temperature of the mask used to simultaneously form the last layer of each stack, are chosen to form independent stacks spaced apart from one another, belonging to distinct microcomponents.

7. Method according to claim 5, wherein the distance between two adjacent openings and the difference between the temperature of the mask used to simultaneously form the first layers of the different stacks, and the temperature of the mask used to simultaneously form the last layer of each stack, are chosen such as to make the last layer of a stack overlap with the first layer of an adjacent stack so as to connect two adjacent stacks of the same microcomponent in series.

8. Method according to claim 7, wherein the openings of the mask, associated with the stacks of the same microcomponent, form a group of openings, and the distance between two groups of adjacent openings is chosen such as to form two microcomponents spaced apart from one another.

9. Method according to claim 1, wherein the microcomponent is a microbattery.

10. Method according to claim 1, wherein the mask is subdivided into at least two elemental parts separated by expansion joints.

11. Method according to claim 1, wherein the mask comprises a recess around each opening on a bottom surface, on the substrate side.

12. Method according to claim 1, wherein the mask is raised with respect to the substrate by shims.

13. Method according to claim 1, comprising heating the substrate to the first temperature so as to heat the mask to the first temperature.

14. Method according to claim 1, wherein the second temperature is higher than the first temperature and the mask is configured so that the second pattern overlaps the first pattern.

\* \* \* \* \*